(12) United States Patent
Spiegelman et al.

(10) Patent No.: US 12,648,117 B2
(45) Date of Patent: Jun. 2, 2026

(54) SERVICEABLE PERIPHERAL CONNECTION DEVICE

(71) Applicant: Microsoft Technology Licensing, LLC, Redmond, WA (US)

(72) Inventors: Adam Kristopher Spiegelman, The Hills, TX (US); Shane Gerrard Kavanagh, Leander, TX (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 283 days.

(21) Appl. No.: 18/206,527

(22) Filed: Jun. 6, 2023

(65) Prior Publication Data

US 2024/0414888 A1 Dec. 12, 2024

(51) Int. Cl.
*H05K 7/20* (2006.01)
*G06F 1/20* (2006.01)

(52) U.S. Cl.
CPC ........... *H05K 7/20727* (2013.01); *G06F 1/20* (2013.01)

(58) Field of Classification Search
CPC ........... H05K 7/20727; H05K 7/20172; H05K 7/1487; G06F 1/20
See application file for complete search history.

(56) References Cited

U.S. PATENT DOCUMENTS

| | | | | |
|---|---|---|---|---|
| 7,054,155 B1 * | 5/2006 | Mease | ................ | H05K 7/20581 |
| | | | | 165/104.34 |
| 7,688,585 B2 * | 3/2010 | Yin | ........................... | G06F 1/20 |
| | | | | 361/679.48 |
| 8,089,754 B2 * | 1/2012 | Peng | ........................ | G06F 1/20 |
| | | | | 361/679.48 |
| 8,570,743 B2 * | 10/2013 | Pang | ................... | H05K 7/20172 |
| | | | | 361/679.48 |
| 9,265,175 B2 * | 2/2016 | Yoshida | ................ | F04D 29/646 |
| 11,641,726 B1 | 5/2023 | Jagadeesan | | |
| 11,781,555 B2 * | 10/2023 | Chen | ..................... | F04D 29/602 |
| | | | | 361/126 |
| 11,800,693 B1 * | 10/2023 | Sampath | ............ | H05K 7/20736 |
| 11,925,004 B2 * | 3/2024 | Killen, Jr. | ................ | G06F 1/20 |
| 2011/0122572 A1 * | 5/2011 | Cheng | ................ | H05K 7/20736 |
| | | | | 361/679.48 |
| 2011/0122573 A1 * | 5/2011 | Peng | ........................ | G06F 1/20 |
| | | | | 361/679.48 |
| 2020/0146185 A1 | 5/2020 | Wu | | |
| 2021/0259138 A1 * | 8/2021 | Korolenko | ............... | G06F 1/20 |

(Continued)

OTHER PUBLICATIONS

International Search Report and Written Opinion received for PCT Application No. PCT/US2024/030682, mailed on Sep. 24, 2024, 14 pages.

*Primary Examiner* — Stephen S Sul
(74) *Attorney, Agent, or Firm* — Ray Quinney & Nebeker P.C.; John O. Carpenter

(57) ABSTRACT

A device may include a body including a channel therein, wherein the channel includes a longitudinal component and a lateral component transverse to the longitudinal component and at least a portion of the channel is diagonal to a longitudinal direction. A device may include a frame with rails to receive the body and allow longitudinal movement of the body relative to the frame in the longitudinal direction. A device may include a carrier connected to the body by fasteners positioned in the channels and movable relative to the body via movement of the fasteners within the channels.

20 Claims, 8 Drawing Sheets

(56)     References Cited

U.S. PATENT DOCUMENTS

| | | | | |
|---|---|---|---|---|
| 2022/0141995 A1* | 5/2022 | Dikken | .............. | H05K 7/20172 |
| | | | | 361/679.48 |
| 2022/0366939 A1* | 11/2022 | Geng | ...................... | G06F 1/187 |
| 2023/0016259 A1* | 1/2023 | Zhong | ............... | H05K 7/20727 |
| 2023/0124080 A1* | 4/2023 | Lewis | ............... | H05K 7/20736 |
| | | | | 361/695 |

* cited by examiner

546

548 Inserting a connection device into a frame in a longitudinal direction

550 Actuating the connection device in a lateral direction transverse to the longitudinal direction 552 Securing the connection device to the frame

SERVICEABLE PERIPHERAL CONNECTION DEVICE

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Datacenters and other server rooms and racks locate a large quantity of server computers in a small space to increase computing density. High density server arrangements, however, can render servicing the computers and racks supporting the computers difficult.

BRIEF SUMMARY

In some aspects, the techniques described herein relate to a device including: a body including a channel therein, wherein the channel includes a longitudinal component and a lateral component transverse to the longitudinal component and at least a portion of the channel is diagonal to a longitudinal direction; a frame with rails to receive the body and allow longitudinal movement of the body relative to the frame in the longitudinal direction; and a carrier connected to the body by fasteners positioned in the channels and movable relative to the body via movement of the fasteners within the channels.

In some aspects, the techniques described herein relate to a method for installing a computing component, including: inserting a connection device into a frame in a longitudinal direction; actuating the connection device in a lateral direction transverse to the longitudinal direction; and securing the connection device to the frame.

In some aspects, the techniques described herein relate to a device including: a body; a carrier movably connected to the body, carrier supporting a connector; a frame to receive the body and allow longitudinal movement of the body relative to the frame in a longitudinal direction; and means for converting a first force on the body in a first direction to a second force on the carrier in a second direction and move the connector in the second direction.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 4-1 through FIG. 4-3 illustrate connecting a peripheral module to a server chassis, according to at least one embodiment of the present disclosure;

DETAILED DESCRIPTION

Figure 1:
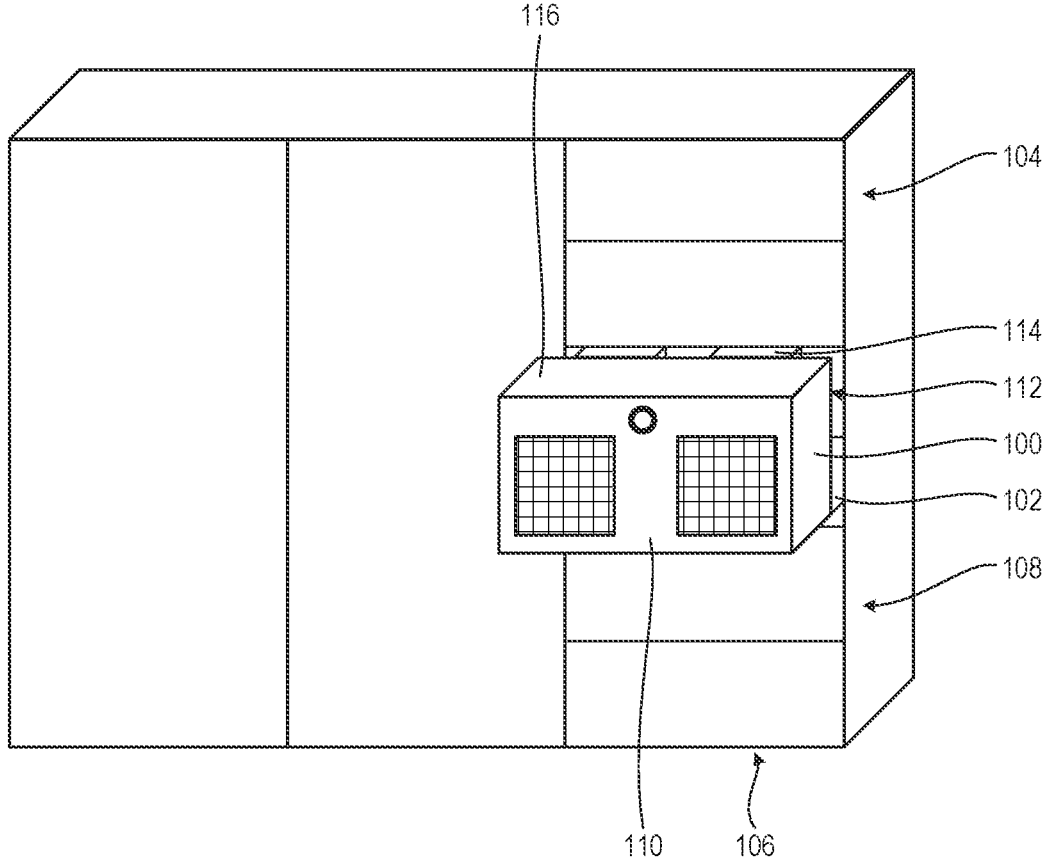
FIG. 1 is a perspective view of a server computer chassis movable in a drawer relative to a server rack, according to at least one embodiment of the present disclosure.

The present disclosure relates generally to systems and methods for connecting peripheral devices to an electronic device. More particularly, the present disclosure relates to systems and methods for connecting peripheral devices to electronic devices in a server rack or other array of computing devices. For example, in a server rack or other array of computing devices, the computing devices are arranged in with little open space between the computing devices. While a densely packed arrangement of computing devices allows for a high compute power in a small volume, the density of the arrangement limits air flow or other cooling fluid flow through, over, and across the heat-generating components of the computing devices and/or server rack. Server racks or other arrays of computing devices, therefore, use active cooling to force air or other cooling fluids through, over, and across the heat-generating components of the computing devices and/or server rack.

In some embodiments, the active cooling includes fan modules coupled to a server (or other computer) chassis to force air flow through, over, and across the heat-generating components of the computing device. In some embodiments, the server rack is oriented with a first side of the server rack facing a cold aisle of the room or datacenter and a second side of the server rack facing a hot aisle of the room or datacenter. The fan module draws cold air from the cold aisle; flows the air through, over, and across the heat-generating components of the computing device; and exhausts the hot air (heated by the heat-generating components) to the hot aisle.

In some embodiments, the active cooling includes liquid cooling of the heat-generating components of the computing device(s). In some embodiments, the working fluid of the liquid cooling is provided through a manifold to a plurality of computing devices through liquid connectors. In some embodiments, the server rack is oriented with a first side of the server rack facing a service area of the room or data-center and a second side of the server rack facing the manifold of the server rack.

In some embodiments, the hot aisle or region with the manifold is too narrow or too hot for a service technician to access, and the computing device is serviced from the first side (service area) of the server rack. In some embodiments, to allow access to components near the rear surface (e.g., proximate the second side) of the computing device, the server rack includes drawers or other movable supports for the computing devices in the server rack. Even in embodiments with movable supports relative to a frame of the server rack, access to and range of motion relative to the rear of the computing device is limited.

In some embodiments according to the present disclosure, a peripheral connection device allows a service technician or other user to couple peripherals to the rear surface (e.g., proximate the second side) of the computing device with better leverage and more accuracy to save time and to limit damage to the computing device.

In some embodiments, the connection device connects a peripheral to the rear surface of the computing device by allowing the user to move the connection device (and peripheral) in a first direction while the connection device moves the peripheral in a second direction transverse to the first direction to mate a connection between the peripheral and the computing device in the second direction. In some embodiments, the connection is an electrical connection, such as power cable or connection to a bus bar or a bridge connection between cards or components of the computing device. In some embodiments, the connection is a data communication connection, such as an electrically conductive data connection (e.g., ethernet cable) or an optical connection (e.g., fiber optic cable). In some embodiments, the connection is a fluid connection, such as a liquid cooling hose. In some embodiments, the connection is a power connection to the peripheral device, such as a fan module that, when coupled to the rear surface of the server chassis flows air through the server chassis from a cold aisle to a hot aisle.

In some embodiments, the connection device includes one or more alignment mechanisms to assist and/or ensure the proper alignment of a peripheral connector or the peripheral device with a complementary connector of the computing device. In some embodiments, by assisting and/or ensuring the proper alignment of the peripheral connector with the complementary connector of the computing device, the connection device can limit and/or prevent damage to the connectors. In some embodiments, by assisting and/or ensuring the proper alignment of the peripheral connector with the complementary connector of the computing device, the connection device can limit and/or prevent damage to the printed circuit board (PCB) of the computing device to which the complementary connector is fixed. In some embodiments, by assisting and/or ensuring the proper alignment of the peripheral connector with the complementary connector of the computing device, the connection device can facilitate a blind mating of the connectors when the service technician is unable to directly see the connectors.

FIG. 1 is a perspective view of a server computer 100 movable in a drawer 102 relative to a server rack 104, according to at least one embodiment of the present disclosure. The server rack 104 has a first side 106 and a second side 108, where the drawer 102 opens to the first side 106 and away from the second side 108. In some embodiments, the cold aisle is proximate the first side 106 and the hot aisle is proximate the second side 108. The server computer 100 has a front surface 110 that is proximate the first side 106 of the server rack 104 and a rear surface 112 that is proximate the second side 108 of the server rack 104. In some embodiments, connections on or near the rear surface 112 are difficult to access and/or align during service of the server computer 100, even when the drawer 102 is moved forward from the server rack 104. For example, mating a connection between a peripheral, such as a fan module 114, on a rear surface 112 of the server chassis 116 is difficult. In some embodiments, applying sufficient leverage or force to the fan module 114 or other peripheral against the rear surface 112 is difficult without risk of damage to the peripheral, the server computer 100, or the connection therebetween.

Figure 2:
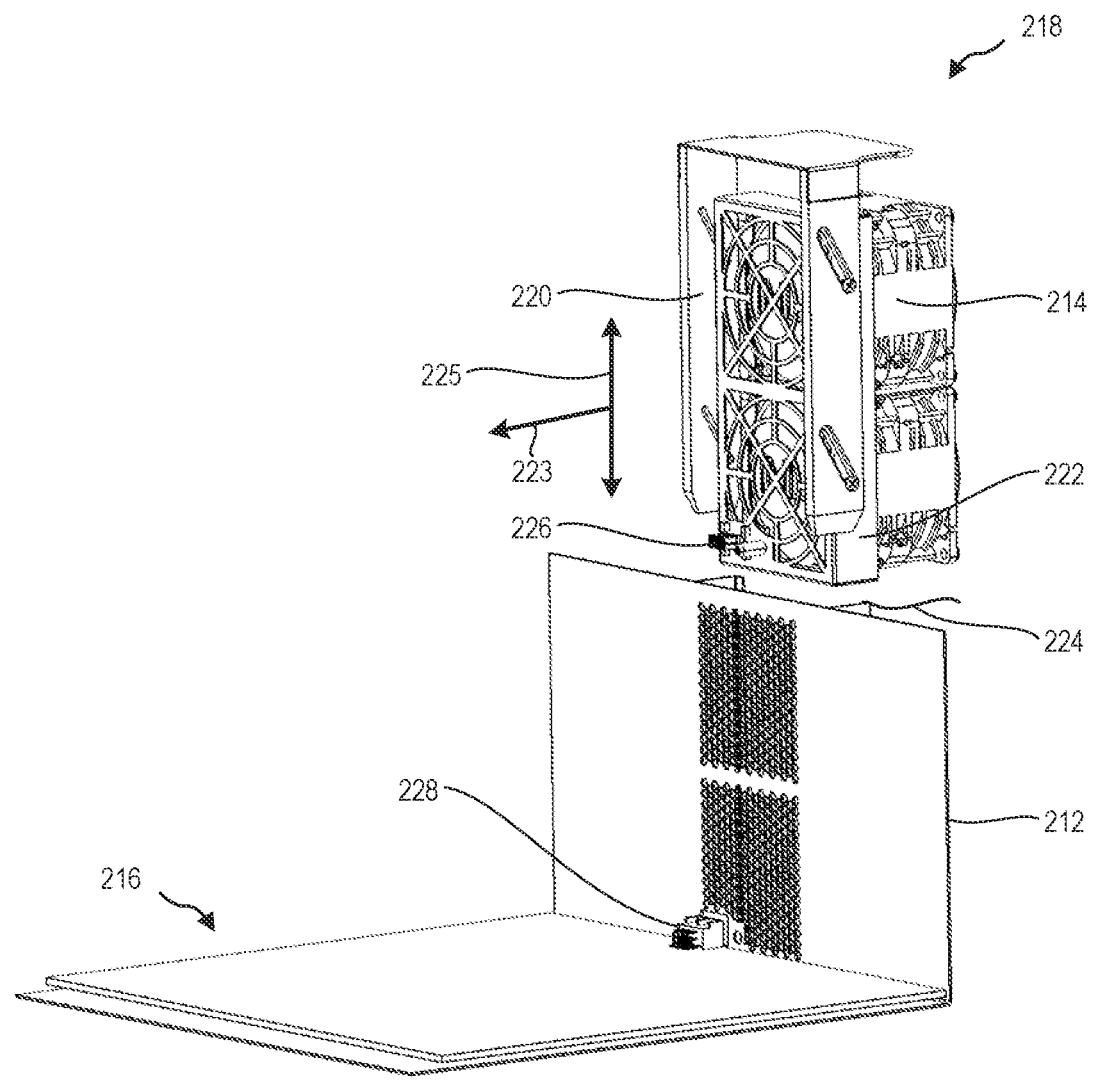
FIG. 2 is a front perspective view of a server chassis and connection device for connecting a peripheral module to the server chassis, according to at least one embodiment of the present disclosure.

FIG. 2 is a front perspective view of an embodiment of a server chassis 216 and connection device 218 for connecting a fan module 214 or other peripheral to the server chassis 216. It should be understood that, while embodiments illustrated and described herein refer to a fan module 214, any peripheral with a connection to the server or server chassis 216 is contemplated herein. In some embodiments, the peripheral is a cooling module, such as a fan module or a liquid cooling connection between a cold plate of a computing device and a manifold configured to provide working fluid. In some embodiments, the connection device 218 includes a body 220 and a carrier 222 that is movably connected to the body 220. The carrier 222 supports the fan module 214, and the carrier 222 is movable relative to the body 220 in at least a lateral direction 223 that is transverse to a longitudinal direction 225 of the connection device 218.

In some embodiments, the body 220 of the connection device 218 is slidably connectable to a frame 224 of the connection device 218. In some embodiments, the frame 224 is fixed to the server chassis 216 (e.g., affixed to and/or integrally formed with a rear surface 212 of the server chassis 216). The frame 224 assists in aligning a first connector 226 of the fan module 214 with a complementary second connector 228 fixed to the server chassis 216. In some embodiments, the body 220 slides in the longitudinal direction 225 through or into the frame 224. In some embodiments, the body 220 slides within the frame 224. In some embodiments, a portion of the body 220 is outside of the frame 224.

Figure 3:
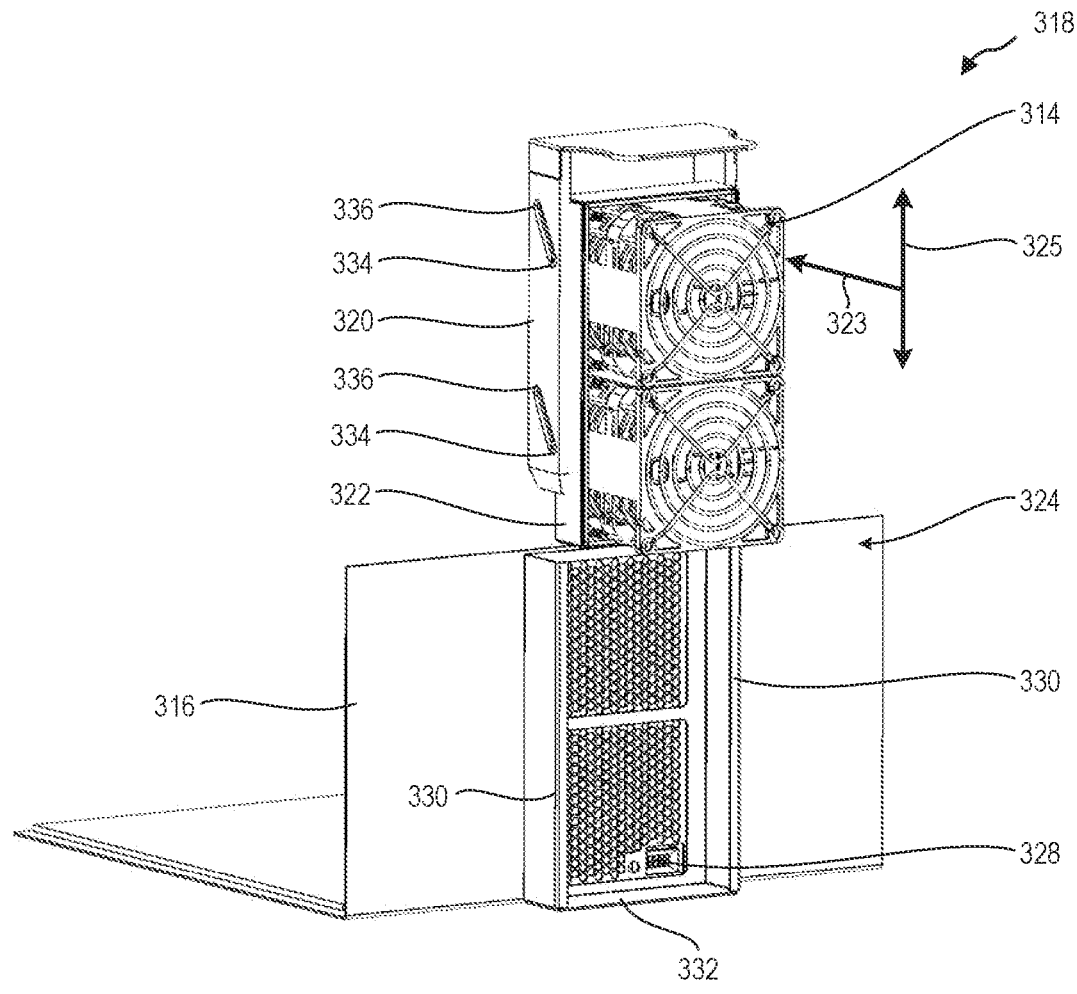
FIG. 3 is a rear perspective view of the server chassis and connection device of FIG. 2, according to at least one embodiment of the present disclosure.

FIG. 3 is a rear perspective view of a server chassis 316 and connection device 318, such as described in relation to FIG. 2. In some embodiments, the frame 324 includes at least one rail 330 that mechanically interlocks with at least a portion of the connection device 318 to align the connection device 318 with the server chassis 316. In some embodiments, the frame 324 includes a pair of rails 330 that interlock with and allow the body 320 to slide in a longitudinal direction 325 in the frame 324. When the carrier 322 contacts a bottom surface 332 of the frame 324 and/or server chassis 316, the carrier 322 moves in the lateral direction 323 relative to the body 320 and frame 324.

Upon moving in the lateral direction 323, the carrier 322 moves the fan module 314 in the lateral direction 323 towards the second connector 328 to mate the first connector (such as the first connector 226 of FIG. 2) to the second connector 328. In some embodiments, the rails 330 and bottom surface 332 of the frame 324 align the connection.

The carrier 322 is movable relative to the body 320 in at least the lateral direction 323. In some embodiments, the carrier 322 is movable relative to the body 320 in both the lateral direction 323 and the longitudinal direction 325. In some embodiments, the carrier 322 is movable relative to the body 320 in a direction with components in the lateral direction 323 and the longitudinal direction 325.

In some embodiments, the body 320 is connected to the carrier 322 by one or more fasteners 334 located in one or more channels 336. The fasteners 334 are movable within the channels 336 to allow movement of the carrier 322 relative to the body 320 according to the shape and length of the channels 336. In some embodiments, moving the body 320 in the longitudinal direction 325 relative to the carrier 322 produces a resultant transverse movement of the carrier 322 relative to the body 320. When the body 320 is inserted into the frame 324 and interlocked with the frame 324, such as when the body 320 is captured within a portion of the rails 330, the carrier 324 is urged in a lateral direction relative to the frame 324 and the server chassis 316.

Figures 1, 4:
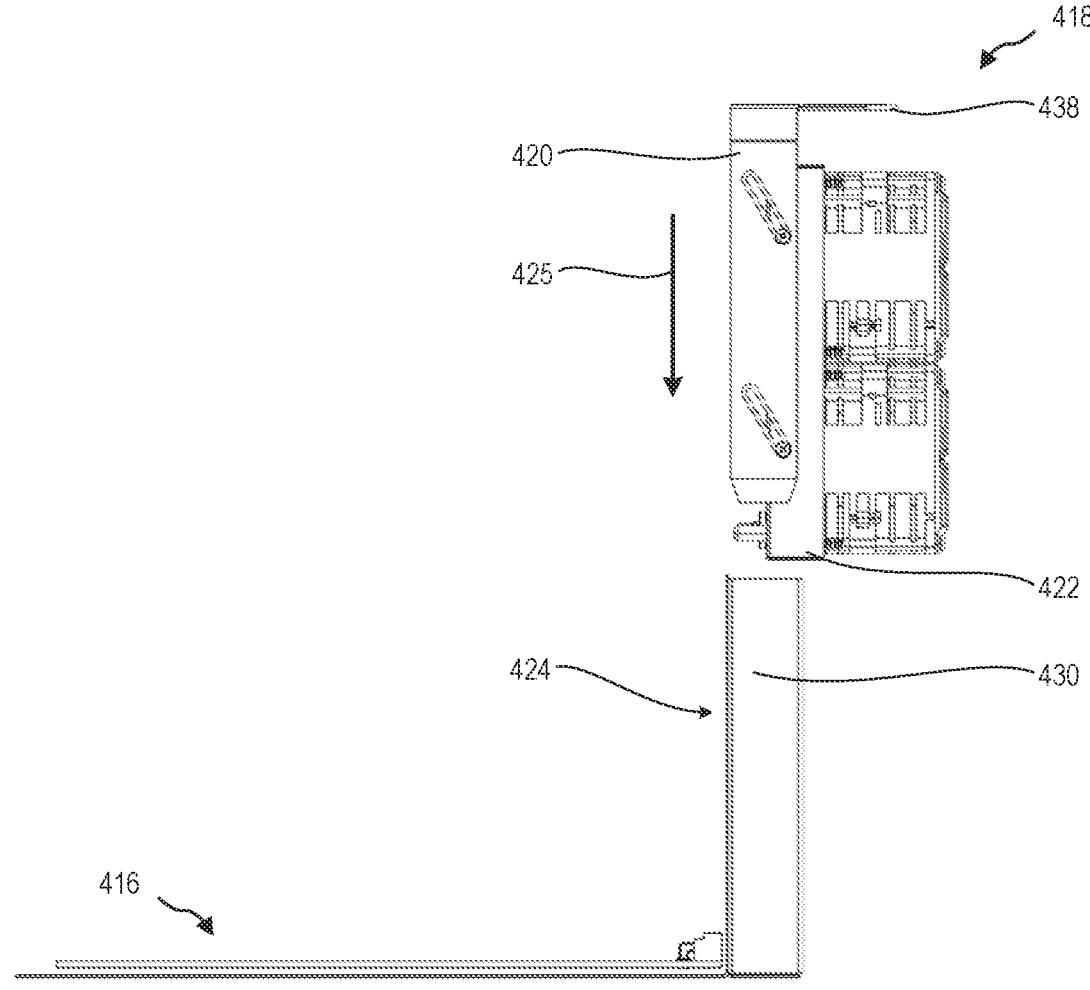
Figures 2, 4:
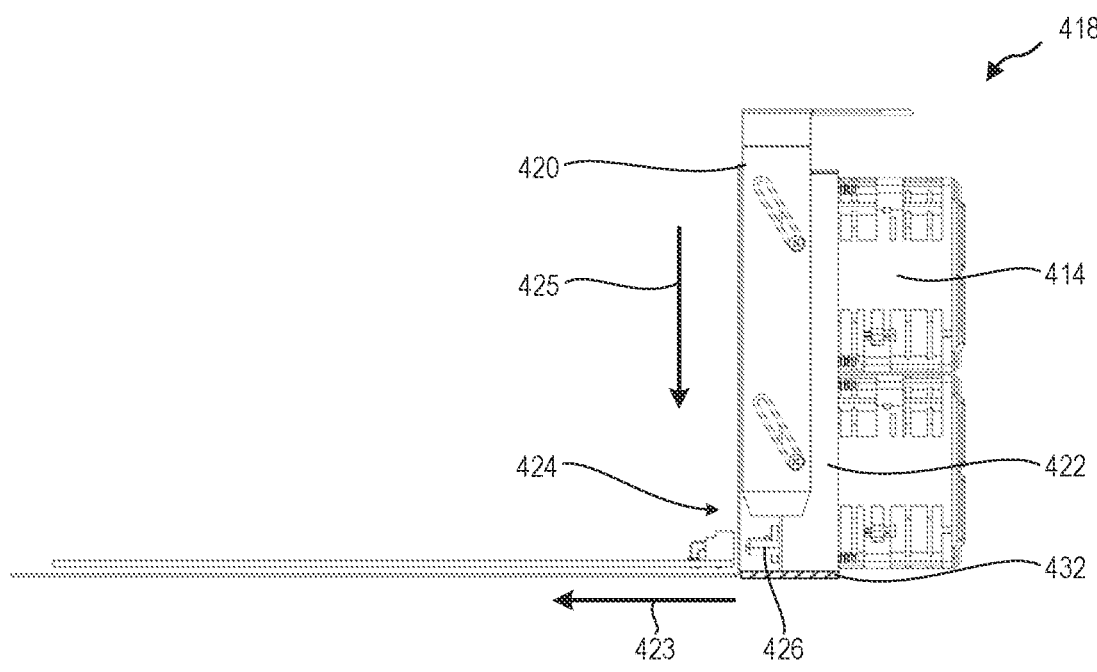
Figures 3, 4:
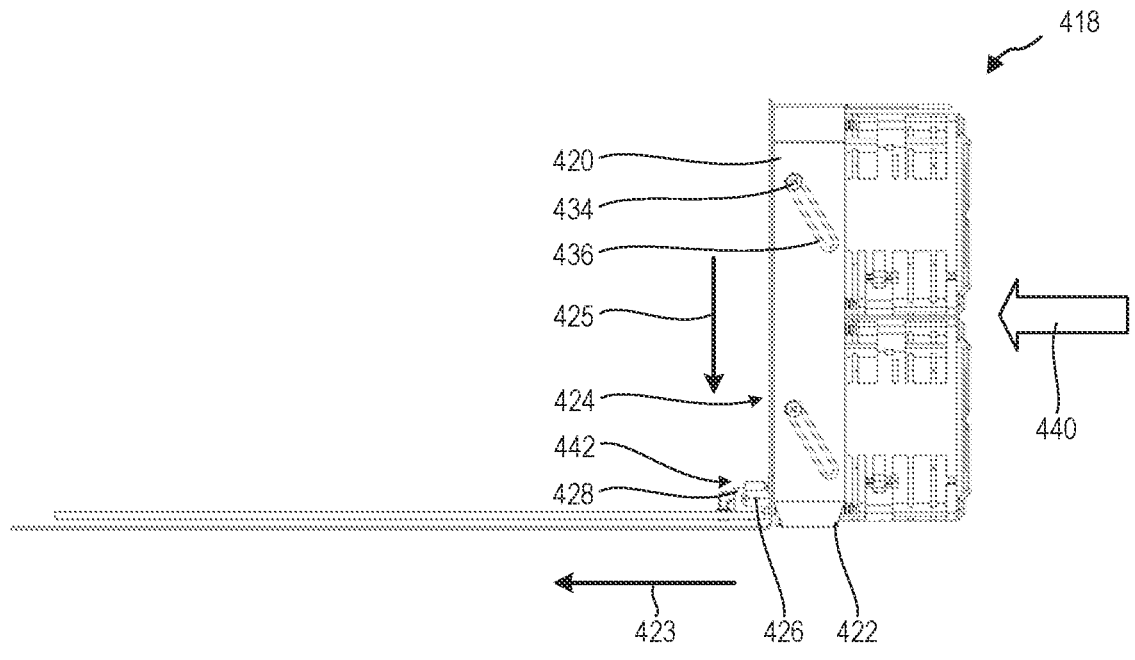

FIG. 4-1 through FIG. 4-3 illustrate a process of connecting a fan module 414 to a server chassis 416 with a connection device 418, according to at least one embodiment of the present disclosure. In some embodiments, the connection device 418 includes a handle 438 to assist a user in inserting the body 420 into the frame 424. As described in relation to FIG. 3, the frame 324, in some embodiments, has rails 430 into which a portion of the body 420 is inserted and captured. The rails 430 allow movement of the connection device 418 and the fan module 414 connected thereto in the longitudinal direction 425.

Referring now to FIG. 4-2, as the connection device 418 and fan module 414 move in the longitudinal direction 425 relative to the frame 424, the carrier 422 contacts the bottom surface 432 of the frame 424. The carrier 422 and fan module 414 coupled thereto stop moving in the longitudinal direction 425, while the body 420 of the connection device 420 continues moving in the longitudinal direction 425. In some embodiments, when the connection device 418 is in the frame 424 and the carrier 422 is in contact with the bottom surface 432, the first connector 426 and the second connector 428 are aligned in the transverse direction 423.

Referring now to FIG. 4-3, in some embodiments, continued longitudinal movement of the body 420 when the carrier 422 is in contact with the bottom surface 432 causes the fasteners 434 to translate within the channels 436. In some embodiments, the translation of the fasteners 434 within the channel 436 allows the continued longitudinal movement of the body 420 relative to the frame 424 and relative to the carrier 422. In some embodiments, the translation of the fasteners 434 within the channel 436 creates a transverse force 440 on the carrier 422 relative to the body 420. When the body 420 is fixed by the frame 424 in the transverse direction 423 relative to the server chassis 416, the transverse force 440 on the carrier 422 relative to the body 420 urges the carrier 422 toward the server chassis 416 and mates the connection 442 of the first connector 426 and the second connector 428.

The disconnection process works in reverse with a longitudinal movement in the opposite longitudinal direction producing a second transverse force opposite to the first transverse force 440, which disconnects the connection 442 before the carrier 422 and fan module 414 move in the longitudinal direction 425.

FIG. 4-1 through FIG. 4-3 illustrate an embodiment of a connection device 418 with channels that are substantially linear in a diagonal direction with components in each of a longitudinal direction 425 and a transverse direction 423. In some embodiments, the channels of a connection device, according to the present disclosure, are at least partially curved. For example, the slope of the channel relative to the longitudinal direction changes the lateral movement relative to a constant longitudinal movement of the body on the connection device. In some embodiments, the channels of a connection device, according to the present disclosure, are at least partially curved. In such examples, the lateral movement produced by a constant longitudinal movement varies based on the position of the fastener in the channel. In some embodiments, the channels of the connection device include linear portions with at least one discontinuity. In an example, the channel has two portions with different slopes relative to the longitudinal direction connected by a discontinuity (e.g., no curved portion between). In at least one embodiment, at least a portion of the channel is parallel to the longitudinal direction. In at least one embodiment, the full length of the channel is non-parallel to the longitudinal direction. The slope, linearity, and curvature of the channels can allow different transverse forces and/or different clearance needed to fit the connection device behind the server chassis.

In some embodiments, the fasteners are fixed to the carrier and the channels are formed in the body. However, it should be understood that, in some embodiments, the fasteners are fixed to the body and the channels are formed in the carrier.

Figure 5:
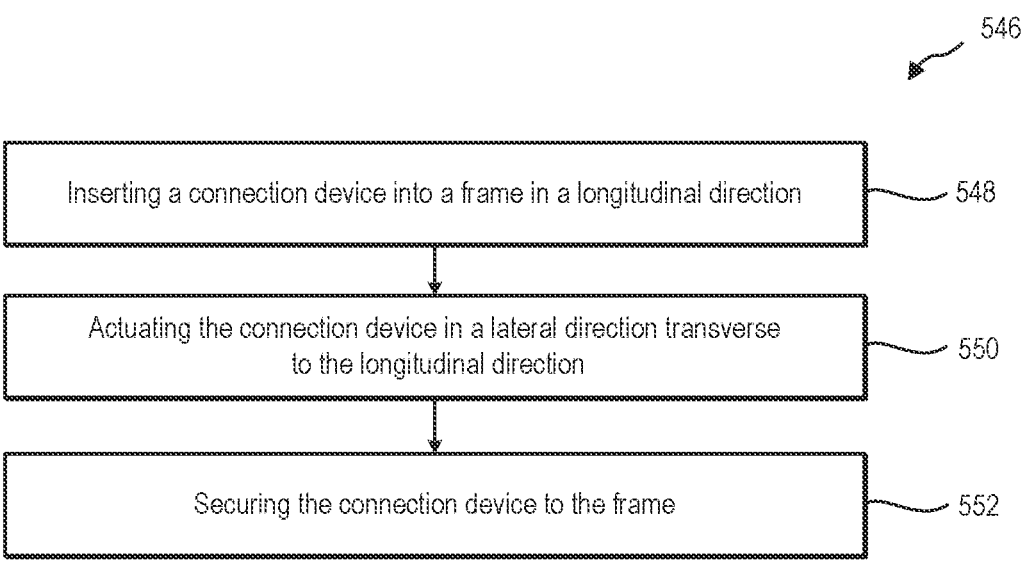
FIG. 5 is a flowchart illustrating a method of connecting a peripheral module to a server chassis, according to at least one embodiment of the present disclosure.

FIG. 5 is a flowchart illustrating an embodiment of a method 546 of connecting a peripheral to a server chassis. In some embodiments, the method 546 includes inserting a connection device into a frame in a longitudinal direction at 548, such as described in relation to the embodiments illustrated in FIG. 2 through FIG. 4-3. In some embodiments, the frame is coupled to a server chassis. In some embodiments, the frame is integrally formed with the server chassis.

In some embodiments, the method 546 includes actuating the connection device in a lateral direction transverse to the longitudinal direction at 550. In some embodiments, actuating the connection device in a lateral direction transverse to the longitudinal direction includes applying a longitudinal force to a body of the connection device to move the body in a longitudinal direction relative to the carrier of the connection device. In some embodiments, a portion of the connection device converts the longitudinal force on the body to a transverse force on the carrier to move the carrier in the transverse direction relative to the body and relative to the server chassis. In some embodiments, a means for actuating the connection device in a lateral direction transverse to the longitudinal direction includes any of the described embodiments of a channel, a linkage, or any other means for converting the longitudinal force on the body to a lateral force on the carrier or converting the longitudinal movement of the body to a lateral movement of the carrier.

In some embodiments, the conversion of at least a portion of the longitudinal force to the transverse force includes translating fasteners in channels, wherein at least a portion of the channel is oriented diagonal to the longitudinal direction. For example, at least a portion of the channel is oriented with a component in the longitudinal direction and component in the transverse direction. Translation of the fastener through the diagonal portion of the channel converts the longitudinal force and/or movement of the body to a transverse force on and/or movement of the carrier. In some embodiments, at least a portion of the channel is linear. In some embodiments, at least a portion of the channel is curved.

In some embodiments, the conversion of at least a portion of the longitudinal force to the transverse force includes rotating a linkage, as will be described in more detail in relation to FIG. 7. In some embodiments, the longitudinal force on the body urges the linkage through an arc that moves the carrier in the transverse direction relative to the body of the connection device in response to the longitudinal movement of the carrier and body relative to one another.

In some embodiments, the relative longitudinal movement of the body and carrier is produced by a longitudinal force applied to the body while the carrier contacts a bottom surface of the frame (such as described in relation to FIG. 4-1 through FIG. 4-3). In some embodiments, the carrier contacts a bottom surface of the server chassis. In some embodiments, the carrier contacts the PCB.

In some embodiments, it is undesirable to apply a force to the frame, server chassis, PCB, or other components of the computing device and/or server rack. In some embodiments, a relative longitudinal movement of the body and carrier is produced by a longitudinal compression force applied by a user to the body and carrier. In some embodiments, as will be described in more detail in relation to FIG. 6, the body has a first handle and the carrier has a second handle. A user compresses the first handle and second handle together, such as with a single hand, to produce a compressive force between the body and the carrier to move the body and carrier toward one another in the longitudinal direction.

In some embodiments, the method 546 optionally includes securing the connection device to the frame at 552. In some embodiments, securing the connection device includes mating the connection between the first connector of a peripheral coupled to the connection device and a second connector fixed relative to the server chassis. In some embodiments, the friction fit therebetween secures the connection device relative to the server chassis. In some embodiments, the connection device is further secured by gravity retaining the connection device captured in the frame and contacting a bottom surface of the frame, server chassis, or PCB. In some embodiments, securing the connection device to the frame includes moving the body and/or carrier into or past a detent in the frame. In some embodiments, a detent is oriented in a transverse direction to secure the carrier upon mating of the connection. In some embodiments, a detent is oriented in a longitudinal direction to secure the body in the rails of the frame.

Figure 6:
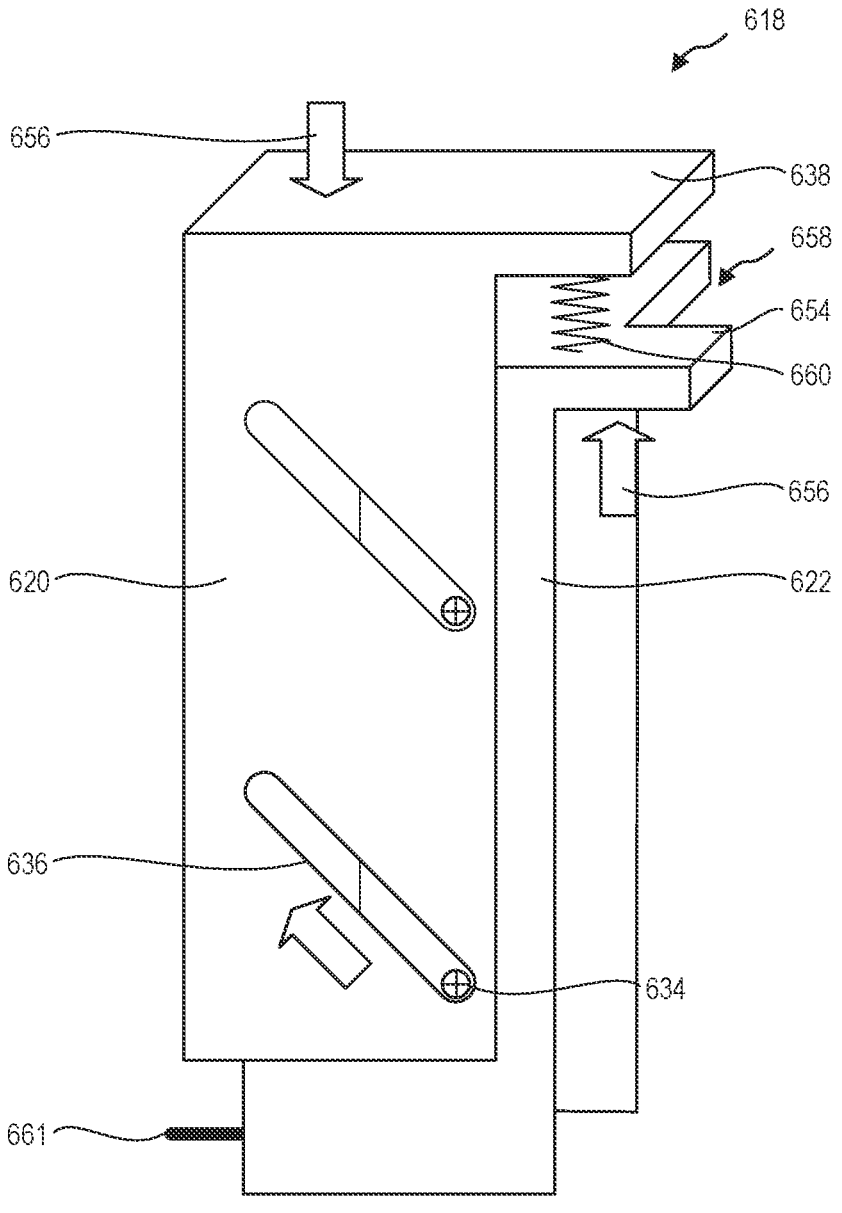
FIG. 6 is a side view of a connection device with a pair of handles on a body and a carrier, according to at least one embodiment of the present disclosure.

FIG. 6 is a side view of a connection device 618 with a pair of handles 628, 654 on a body 620 and a carrier 622, respectively, according to at least one embodiment of the present disclosure. In some embodiments, it is undesirable to apply a longitudinal force to the bottom surface of the frame, server chassis, PCB, or other part of the server computer. In some embodiments, the user can apply a compressive force 656 in a longitudinal direction to actuate the connection device 618 and generate a lateral movement of the carrier 622 relative to the body 620.

In some embodiments, the body 620 has a body handle 628 and the carrier 622 has a carrier handle 654. In some embodiments, the body handle 628 and the carrier handle 654 are arranged to allow a user to apply a compressive force 656 to the body handle 628 and carrier handle 654 toward one another with a single hand, allowing one-handed operation. In some embodiments, the compressive force 656 moves the body 620 and the carrier 622 relative to one another according to the movement of one or more fasteners 634 in complementary channels 636. As described herein, the channels 636 may be linear, curved, discontinuous, or any combinations thereof.

In some embodiments, the carrier 622 includes a notch 658 in the carrier handle 654 and/or adjacent to the body handle 638 to allow a user to apply a longitudinal force to the body handle 638 to move the body 620 away from the carrier 622 and remove the connection device 618.

In some embodiments, a biasing element 660 applies an expansion force between the body 620 and the carrier 622 to assist a user in applying a longitudinal force to the body handle 638 to move the body 620 away from the carrier 622 and remove the connection device 618.

In some embodiments, a connection device 618 configured to receive a compressive force from a user, such as described in relation to FIG. 6, is used without a frame including a bottom surface to align a connection. In some embodiments, a connection device includes one or more alignment pins 661 or other alignment features to align the carrier 622 with the frame and/or the server chassis before mating the connection. In some embodiments, the alignment pin 661 or other alignment feature protrudes from the carrier 622 in the lateral direction. The alignment pin 661 or other alignment feature interacts with a complementary alignment receiver on the frame and/or server chassis. In at least one embodiment, the alignment pin 661 or other alignment feature protrudes from the carrier 622 a greater distance than the first connector in the lateral direction, such that the alignment pin 661 or other alignment feature engages the alignment receiver of the frame and/or server chassis before the first connector contacts the second connector or another portion of the frame and/or server chassis.

Figure 7:
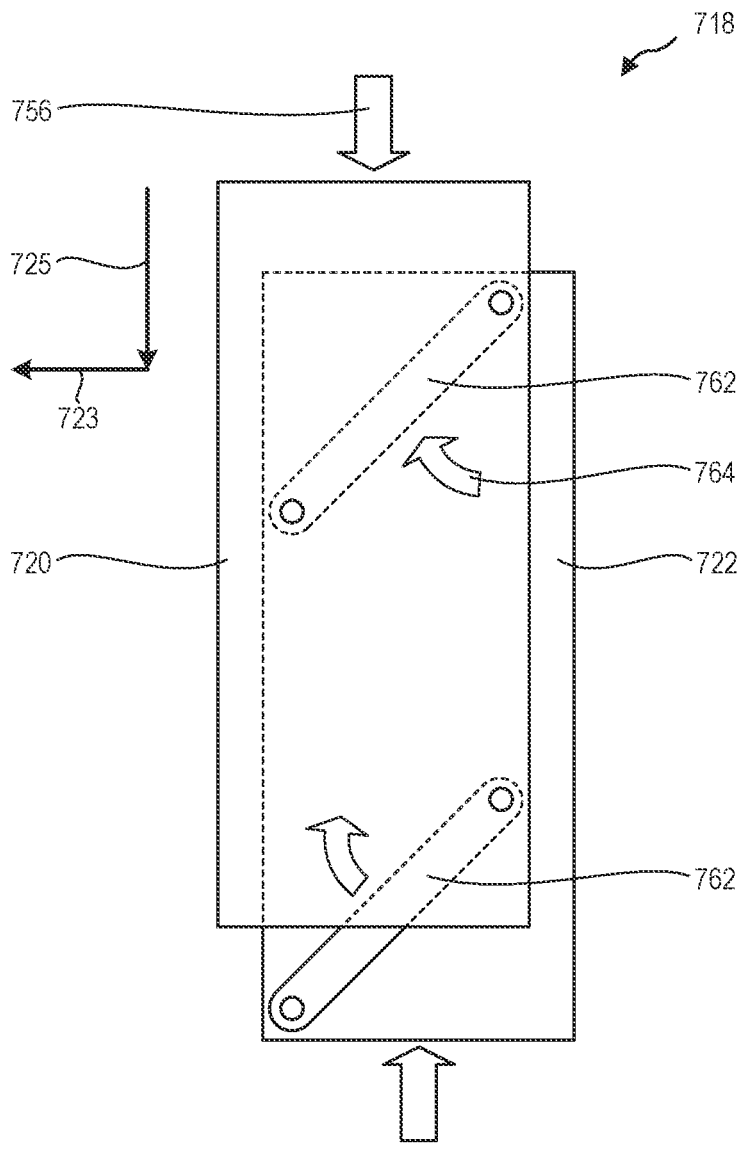
FIG. 7 is a side view of a connection device with a linkage to movably connect a body and a carrier, according to at least one embodiment of the present disclosure.

FIG. 7 is a side view of a connection device 718 with a linkage 762 to movably connect a body 720 and a carrier 722, according to at least one embodiment of the present disclosure. The linkage 762 is oriented at an angle to the longitudinal direction 725 and the lateral direction 723, such that a compressive force 756 applied in the longitudinal direction 725 produces both a longitudinal movement of the carrier 722 relative to the body 720 and a lateral movement of the carrier 722 relative to the body 720. For example, the compressive force 756 applied in the longitudinal direction 725 causes the linkage 762 to move the carrier 722 in an arcuate path 764 relative to the body 720 including both a longitudinal movement of the carrier 722 relative to the body 720 and a lateral movement of the carrier 722 relative to the body 720.

INDUSTRIAL APPLICABILITY

The present disclosure relates generally to systems and methods for connecting peripheral devices to an electronic device. More particularly, the present disclosure relates to systems and methods for connecting peripheral devices to electronic devices in a server rack or other array of computing devices. For example, in a server rack or other array of computing devices, the computing devices are arranged in with little open space between the computing devices. While a densely packed arrangement of computing devices allows for a high compute power in a small volume, the density of the arrangement limits air flow or other cooling fluid flow through, over, and across the heat-generating components of the computing devices and/or server rack. Server racks or other arrays of computing devices, therefore, use active cooling to force air or other cooling fluids through, over, and across the heat-generating components of the computing devices and/or server rack.

In some embodiments, the active cooling includes fan modules coupled to a server (or other computer) chassis to force air flow through, over, and across the heat-generating components of the computing device. In some embodiments, the server rack is oriented with a first side of the server rack facing a cold aisle of the room or datacenter and a second side of the server rack facing a hot aisle of the room or datacenter. The fan module draws cold air from the cold aisle; flows the air through, over, and across the heat-generating components of the computing device; and exhausts the hot air (heated by the heat-generating components) to the hot aisle.

In some embodiments, the active cooling includes liquid cooling of the heat-generating components of the computing device(s). In some embodiments, the working fluid of the liquid cooling is provided through a manifold to a plurality of computing devices through liquid connectors. In some embodiments, the server rack is oriented with a first side of the server rack facing a service area of the room or datacenter and a second side of the server rack facing the manifold of the server rack.

In some embodiments, the hot aisle or region with the manifold is too narrow or too hot for a service technician to access, and the computing device is serviced from the first side (service area) of the server rack. In some embodiments, to allow access to components near the rear surface (e.g., proximate the second side) of the computing device, the server rack includes drawers or other movable supports for the computing devices in the server rack. Even in embodiments with movable supports relative to a frame of the server rack, access to and range of motion relative to the rear of the computing device is limited.

In some embodiments according to the present disclosure, a peripheral connection device allows a service technician or other user to couple peripherals to the rear surface (e.g., proximate the second side) of the computing device with better leverage and more accuracy to save time and to limit damage to the computing device.

In some embodiments, the connection device connects a peripheral to the rear surface of the computing device by allowing the user to move the connection device (and peripheral) in a first direction while the connection device moves the peripheral in a second direction transverse to the first direction to mate a connection between the peripheral and the computing device in the second direction. In some embodiments, the connection is an electrical connection, such as power cable or connection to a bus bar or a bridge connection between cards or components of the computing device. In some embodiments, the connection is a data communication connection, such as an electrically conductive data connection (e.g., ethernet cable) or an optical connection (e.g., fiber optic cable). In some embodiments, the connection is a fluid connection, such as a liquid cooling hose. In some embodiments, the connection is a power connection to the peripheral device, such as a fan module that, when coupled to the rear surface of the server chassis flows air through the server chassis from a cold aisle to a hot aisle.

In some embodiments, the connection device includes one or more alignment mechanisms to assist and/or ensure the proper alignment of a peripheral connector or the peripheral device with a complementary connector of the computing device. In some embodiments, by assisting and/or ensuring the proper alignment of the peripheral connector with the complementary connector of the computing device, the connection device can limit and/or prevent damage to the connectors. In some embodiments, by assisting and/or ensuring the proper alignment of the peripheral connector with the complementary connector of the computing device, the connection device can limit and/or prevent damage to the printed circuit board (PCB) of the computing device to which the complementary connector is fixed. In some embodiments, by assisting and/or ensuring the proper alignment of the peripheral connector with the complementary connector of the computing device, the connection device can facilitate a blind mating of the connectors when the service technician is unable to directly see the connectors.

It should be understood that, while embodiments illustrated and described herein refer to a fan module, any peripheral with a connection to the server or server chassis is contemplated herein. In some embodiments, the peripheral is a cooling module, such as a fan module or a liquid cooling connection between a cold plate of a computing device and a manifold configured to provide working fluid. In some embodiments, the connection device includes a body and a carrier that is movably connected to the body. The carrier supports the fan module, and the carrier is movable relative to the body in at least a lateral direction that is transverse to a longitudinal direction of the connection device.

In some embodiments, the body of the connection device is slidably connectable to a frame of the connection device. In some embodiments, the frame is fixed to the server chassis (e.g., affixed to and/or integrally formed with a rear surface of the server chassis). The frame assists in aligning a first connector of the fan module with a complementary second connector fixed to the server chassis. In some embodiments, the body slides in the longitudinal direction through or into the frame. In some embodiments, the body slides within the frame. In some embodiments, a portion of the body is outside of the frame.

In some embodiments, the frame includes at least one rail that mechanically interlocks with at least a portion of the connection device to align the connection device with the server chassis. In some embodiments, the frame includes a pair of rails that interlock with and allow the body to slide in a longitudinal direction in the frame. When the carrier contacts a bottom surface of the frame and/or server chassis, the carrier moves in the lateral direction relative to the body and frame.

Upon moving in the lateral direction, the carrier moves the fan module in the lateral direction towards the second connector to mate the first connector to the second connector. In some embodiments, the rails and bottom surface of the frame align the connection.

The carrier is movable relative to the body in at least the lateral direction. In some embodiments, the carrier is movable relative to the body in both the lateral direction and the longitudinal direction. In some embodiments, the carrier is movable relative to the body in a direction with components in the lateral direction and the longitudinal direction.

In some embodiments, the body is connected to the carrier by one or more fasteners located in one or more channels. The fasteners are movable within the channels to allow movement of the carrier relative to the body according to the shape and length of the channels. In some embodiments, moving the body in the longitudinal direction relative to the carrier produces a resultant transverse movement of the carrier relative to the body. When the body is inserted into the frame and interlocked with the frame, such as when the body is captured within a portion of the rails, the carrier is urged in a lateral direction relative to the frame and the server chassis.

In some embodiments, the connection device includes a handle to assist a user in inserting the body into the frame. As described herein, the frame, in some embodiments, has rails into which a portion of the body is inserted and captured. The rails allow movement of the connection device and the fan module connected thereto in the longitudinal direction.

In some embodiments, as the connection device and fan module move in the longitudinal direction relative to the frame, the carrier contacts the bottom surface of the frame. The carrier and fan module coupled thereto stop moving in the longitudinal direction, while the body of the connection device continues moving in the longitudinal direction. In some embodiments, when the connection device is in the frame and the carrier is in contact with the bottom surface, the first connector and the second connector are aligned in the transverse direction.

In some embodiments, continued longitudinal movement of the body when the carrier is in contact with the bottom surface causes the fasteners to translate within the channels. In some embodiments, the translation of the fasteners within the channel allows the continued longitudinal movement of the body relative to the frame and relative to the carrier. In some embodiments, the translation of the fasteners within the channel creates a transverse force on the carrier relative to the body. When the body is fixed by the frame in the transverse direction relative to the server chassis, the transverse force on the carrier relative to the body urges the carrier toward the server chassis and mates the connection of the first connector and the second connector.

The disconnection process works in reverse with a longitudinal movement in the opposite longitudinal direction producing a second transverse force opposite to the first transverse force, which disconnects the connection before the carrier and fan module move in the longitudinal direction.

In some embodiments, the channels of a connection device, according to the present disclosure, are at least partially curved. For example, the slope of the channel relative to the longitudinal direction changes the lateral movement relative to a constant longitudinal movement of the body on the connection device. In some embodiments, the channels of a connection device, according to the present disclosure, are at least partially curved. In such examples, the lateral movement produced by a constant longitudinal movement varies based on the position of the fastener in the channel. In some embodiments, the channels of the connection device include linear portions with at least one discontinuity. In an example, the channel has two portions with different slopes relative to the longitudinal direction connected by a discontinuity (e.g., no curved portion between). In at least one embodiment, at least a portion of the channel is parallel to the longitudinal direction. In at least one embodiment, the full length of the channel is non-parallel to the longitudinal direction. The slope, linearity, and curvature of the channels can allow different transverse forces and/or different clearance needed to fit the connection device behind the server chassis.

In some embodiments, the fasteners are fixed to the carrier and the channels are formed in the body. However, it should be understood that, in some embodiments, the fasteners are fixed to the body and the channels are formed in the carrier.

In some embodiments, a method of connecting a peripheral to a server chassis includes inserting a connection device into a frame in a longitudinal direction, such as described in relation to the embodiments herein. In some embodiments, the frame is coupled to a server chassis. In some embodiments, the frame is integrally formed with the server chassis.

In some embodiments, the method includes actuating the connection device in a lateral direction transverse to the longitudinal direction. In some embodiments, actuating the connection device in a lateral direction transverse to the longitudinal direction includes applying a longitudinal force to a body of the connection device to move the body in a longitudinal direction relative to the carrier of the connection device. In some embodiments, a portion of the connection device converts the longitudinal force on the body to a transverse force on the carrier to move the carrier in the transverse direction relative to the body and relative to the server chassis.

In some embodiments, the conversion of at least a portion of the longitudinal force to the transverse force includes translating fasteners in channels, wherein at least a portion of the channel is oriented diagonal to the longitudinal direction. For example, at least a portion of the channel is oriented with a component in the longitudinal direction and component in the transverse direction. Translation of the fastener through the diagonal portion of the channel converts the longitudinal force and/or movement of the body to a transverse force on and/or movement of the carrier. In some embodiments, at least a portion of the channel is linear. In some embodiments, at least a portion of the channel is curved.

In some embodiments, the conversion of at least a portion of the longitudinal force to the transverse force includes rotating a linkage. In some embodiments, the longitudinal force on the body urges the linkage through an arc that moves the carrier in the transverse direction relative to the body of the connection device in response to the longitudinal movement of the carrier and body relative to one another.

In some embodiments, the relative longitudinal movement of the body and carrier is produced by a longitudinal force applied to the body while the carrier contacts a bottom surface of the frame. In some embodiments, the carrier contacts a bottom surface of the server chassis. In some embodiments, the carrier contacts the PCB.

In some embodiments, it is undesirable to apply a force to the frame, server chassis, PCB, or other components of the computing device and/or server rack. In some embodiments, a relative longitudinal movement of the body and carrier is produced by a longitudinal compression force applied by a user to the body and carrier. In some embodiments, the body has a first handle and the carrier has a second handle. A user compresses the first handle and second handle together, such as with a single hand, to produce a compressive force between the body and the carrier to move the body and carrier toward one another in the longitudinal direction.

In some embodiments, the method optionally includes securing the connection device to the frame. In some embodiments, securing the connection device includes mating the connection between the first connector of a peripheral coupled to the connection device and a second connector fixed relative to the server chassis. In some embodiments, the friction fit therebetween secures the connection device relative to the server chassis. In some embodiments, the connection device is further secured by gravity retaining the connection device captured in the frame and contacting a bottom surface of the frame, server chassis, or PCB. In some embodiments, securing the connection device to the frame includes moving the body and/or carrier into or past a detent in the frame. In some embodiments, a detent is oriented in a transverse direction to secure the carrier upon mating of the connection. In some embodiments, a detent is oriented in a longitudinal direction to secure the body in the rails of the frame.

In some embodiments, it is undesirable to apply a longitudinal force to the bottom surface of the frame, server chassis, PCB, or other part of the server computer. In some embodiments, the user can apply a compressive force in a longitudinal direction to actuate the connection device and generate a lateral movement of the carrier relative to the body.

In some embodiments, the body has a body handle, and the carrier has a carrier handle. In some embodiments, the body handle and the carrier handle are arranged to allow a user to apply a compressive force to the body handle and carrier handle toward one another with a single hand, allowing one-handed operation. In some embodiments, the compressive force moves the body and the carrier relative to one another according to the movement of one or more fasteners in complementary channels. As described herein, the channels may be linear, curved, discontinuous, or any combinations thereof.

In some embodiments, the carrier includes a notch in the carrier handle and/or adjacent to the body handle to allow a user to apply a longitudinal force to the body handle to move the body away from the carrier and remove the connection device.

In some embodiments, a biasing element applies an expansion force between the body and the carrier to assist a user in applying a longitudinal force to the body handle to move the body away from the carrier and remove the connection device.

In some embodiments, a connection device configured to receive a compressive force from a user is used without a frame including a bottom surface to align a connection. In some embodiments, a connection device includes one or more alignment pins or other alignment features to align the carrier with the frame and/or the server chassis before mating the connection. In some embodiments, the alignment pin or other alignment feature protrudes from the carrier in the lateral direction. The alignment pin or other alignment feature interacts with a complementary alignment receiver on the frame and/or server chassis. In at least one embodiment, the alignment pin or other alignment feature protrudes from the carrier a greater distance than the first connector in the lateral direction, such that the alignment pin or other alignment feature engages the alignment receiver of the frame and/or server chassis before the first connector contacts the second connector or another portion of the frame and/or server chassis.

In some embodiments, a connection device has a linkage to movably connect a body and a carrier, according to at least one embodiment of the present disclosure. The linkage is oriented at an angle to the longitudinal direction and the lateral direction, such that a compressive force applied in the longitudinal direction produces both a longitudinal movement of the carrier relative to the body and a lateral movement of the carrier relative to the body. For example, the compressive force applied in the longitudinal direction causes the linkage to move the carrier in an arcuate path relative to the body including both a longitudinal movement of the carrier relative to the body and a lateral movement of the carrier relative to the body.

The present disclosure relates to systems and methods for connecting peripheral devices to electronic components and/or devices according to at least the examples provided in the clauses below:

Clause 1. A device comprising: a body including a channel therein, wherein the channel includes a longitudinal component and a lateral component transverse to the longitudinal component and at least a portion of the channel is diagonal to a longitudinal direction; a frame with rails to receive the body and allow longitudinal movement of the body relative to the frame in the longitudinal direction; and a carrier connected to the body by fasteners positioned in the channels and movable relative to the body via movement of the fasteners within the channels.

Clause 2. The device of clause 1, wherein a full length of the channel is non-parallel to the longitudinal direction.

Clause 3. The device of clause 1 or 2, wherein at least a portion of the channel is curved.

Clause 4. The device of any preceding clause, wherein the carrier contacts a bottom surface of the frame.

Clause 5. The device of any preceding clause, wherein the frame is coupled to a server chassis.

Clause 6. The device of any preceding clause, wherein the carrier supports a first connector oriented in the lateral direction.

Clause 7. The device of any preceding clause, further comprising at least one alignment pin coupled to the carrier and oriented in a transverse direction transverse to the longitudinal direction, and an alignment receiver coupled to the frame and configured to receive the alignment pin in a connected state.

Clause 8. A method for installing a computing component, comprising: inserting a connection device into a frame in a longitudinal direction; actuating the connection device in a lateral direction transverse to the longitudinal direction; and securing the connection device to the frame.

Clause 9. The method of clause 8, wherein actuating the connection device in the lateral direction includes applying a force to at least a portion of the connection device in the longitudinal direction.

Clause 10. The method of clause 9, wherein applying the force to at least a portion of the connection device in the longitudinal direction includes compressing the connection device against a portion of the frame.

Clause 11. The method of clause 9, wherein applying the force to at least a portion of the connection device in the longitudinal direction includes urging a body of the connection device toward a carrier of the connection device.

Clause 12. The method of any of clauses 8 through 11, wherein actuating the connection device in a lateral direction includes translating a fastener fixed to a carrier of the connection device relative to a body of the connection device.

Clause 13. The method of any of clauses 8 through 12, further comprising aligning an alignment pin of the connection device with an alignment receiver of the frame before actuating the connection device in a lateral direction.

Clause 14. A device comprising: a body; a carrier movably connected to the body, carrier supporting a connector; a frame to receive the body and allow longitudinal movement of the body relative to the frame in a longitudinal direction; and means for converting a first force on the body in a first direction to a second force on the carrier in a second direction and move the connector in the second direction.

Clause 15. The device of clause 14, wherein the means includes a linkage.

Clause 16. The device of clause 14 or 15, further comprising: a first connector supported by the carrier; and a second connector supported by the frame, wherein the second connector is complementary to the first connector.

Clause 17. The device of clause 16, wherein the first connector and the second connector form an electrical connection.

Clause 18. The device of clause 16, wherein the first connector and the second connector form a fluid connection.

Clause 19. The device of any of clauses 14 through 18, further comprising a cooling module coupled to the carrier.

Clause 20. The device of any of clauses 14 through 19, further comprising a biasing element positioned between the body and carrier to provide an expansive force therebetween.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device comprising:
a body including a channel therein, wherein the channel includes a longitudinal component and a lateral component transverse to the longitudinal component and at least a portion of the channel is diagonal to a longitudinal direction;

a frame configured to connect to a rear surface of a server chassis with rails to receive the body and allow longitudinal movement of the body relative to the frame in the longitudinal direction and wherein the frame is outside of said server chassis; and
a carrier connected to the body by one or more fasteners fixed to the carrier and positioned in the channel and movable relative to the body via movement of the one or more fasteners within the channel, and configured to receive a peripheral component therein,
wherein the channel has a first end of the channel located farther from the frame in the longitudinal direction and closer to the frame in the lateral direction, and the channel has a second end of the channel located closer to the frame in the longitudinal direction and farther from the frame in the lateral direction.

2. The device of claim 1, wherein a full length of the channel is non-parallel to the longitudinal direction.

3. The device of claim 1, wherein at least a portion of the channel is curved.

4. The device of claim 1, wherein the carrier contacts a bottom surface of the frame.

5. The device of claim 1, wherein the frame is coupled to a server chassis.

6. The device of claim 1, wherein the carrier supports a first connector oriented in a lateral direction.

7. The device of claim 1, further comprising at least one alignment pin coupled to the carrier and oriented in a transverse direction transverse to the longitudinal direction, and
an alignment receiver coupled to the frame and configured to receive the at least one alignment pin in a connected state.

8. The device of claim 1, wherein the body includes two sides and a top surface.

9. The device of claim 1, further comprising a first connector supported by the carrier, wherein the first connector is a power connector.

10. A method for installing a computing component, comprising:
inserting a connection device into a frame in a longitudinal direction, wherein the frame is located on a rear surface of a server chassis;
actuating the connection device in a lateral direction transverse to the longitudinal direction,
wherein actuating the connection device in the lateral direction includes applying a force to a first portion of the connection device in the longitudinal direction to move a second portion of the connection device in the lateral direction via a channel, wherein the channel has a first end of the channel located farther from the frame in the longitudinal direction and closer to the frame in the lateral direction, and the channel has a second end of the channel located closer to the frame in the longitudinal direction and farther from the frame in the lateral direction; and
securing the connection device to the frame.

11. The method of claim 10, wherein applying the force to the first portion of the connection device in the longitudinal direction includes compressing the connection device against a portion of the frame.

12. The method of claim 10, wherein applying the force to the first portion of the connection device in the longitudinal direction includes urging a body of the connection device toward a carrier of the connection device.

13. The method of claim 10, wherein actuating the connection device in the lateral direction includes translating a fastener fixed to a carrier of the connection device relative to a body of the connection device.

14. The method of claim 10, further comprising aligning an alignment pin of the connection device with an alignment receiver of the frame before actuating the connection device in the lateral direction.

15. A device comprising:
a body;
a carrier movably connected to the body, carrier supporting a connector;
a frame configured to be affixed to an outside of a rear surface of a server chassis and to receive the body and allow longitudinal movement of the body relative to the frame in a longitudinal direction; and
means for converting a first force on the body in—the longitudinal—direction to a second force on the carrier in a—lateral—direction and move the connector in the—lateral—direction, the means including a channel, wherein the channel has a first end of the channel located farther from the frame in the longitudinal direction and closer to the frame in the lateral direction, and the channel has a second end of the channel located closer to the frame in the longitudinal direction and farther from the frame in the lateral direction.

16. The device of claim 15, further comprising:
a first connector supported by the carrier; and
a second connector supported by the frame, wherein the second connector is complementary to the first connector.

17. The device of claim 16, wherein the first connector and the second connector form an electrical connection.

18. The device of claim 16, wherein the first connector and the second connector form a fluid connection.

19. The device of claim 15, further comprising a cooling module coupled to the carrier.

20. The device of claim 15, further comprising a biasing element positioned between the body and carrier to provide an expansive force therebetween.

* * * * *